(12) United States Patent
Downey et al.

(10) Patent No.: US 6,194,323 B1
(45) Date of Patent: Feb. 27, 2001

(54) DEEP SUB-MICRON METAL ETCH WITH IN-SITU HARD MASK ETCH

(75) Inventors: Stephen Ward Downey; Allen Yen, both of Orlando, FL (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/212,228

(22) Filed: Dec. 16, 1998

(51) Int. Cl.[7] .................................................. H01L 21/00
(52) U.S. Cl. .............................. 438/717; 216/47; 216/75; 438/720; 438/742
(58) Field of Search ...................................... 438/710, 712, 438/717, 720, 742; 216/47, 67, 75, 77, 78

(56) References Cited

U.S. PATENT DOCUMENTS

| | | | |
|---|---|---|---|
| 5,950,106 | * | 9/1999 | May et al. .................... 438/720 X |
| 6,020,269 | * | 2/2000 | Wang et al. .................. 438/720 X |

* cited by examiner

*Primary Examiner*—William Powell

(57) ABSTRACT

The invention includes a process for the production of semiconductor devices comprising the steps of depositing a metal layer on a semiconductor substrate, depositing a hardmask layer on said metal layer, depositing a photoresist on said hardmask layer, patterning said photoresist, thereby exposing and patterning portions of said hardmask layer, etching said exposed portions of said hardmask layer with a hardmask etchant, thereby exposing and patterning portions of said metal layer, removing, or not, said photoresist, and etching said exposed portions of said metal layer with a metal etchant and semiconductor devices made by said process.

22 Claims, 2 Drawing Sheets

DEEP SUB-MICRON METAL ETCH WITH IN-SITU HARD MASK ETCH

FIELD OF THE INVENTION

This invention relates to integrated circuits and semiconductor devices and methods for making same.

BACKGROUND OF THE INVENTION

As the width of the metal lines in silicon and other semiconductor devices shrink to 0.30 micron and lower, the thickness of photoresist (PR) required to pattern the metal lines present as conductors needs to decrease substantially to enhance the resolution. Typically, photoresist is applied directly on top of a metal layer to be etched. However, simply decreasing the thickness of photoresist results in insufficient photoresist being present to obtain a correctly shaped metal line following metal etching. While systems of photoresist of at least 1 micron in thickness, and silicon nitride hardmask of about 300 nm in thickness are know, they are not thin enough and do not have the etch selectivity to support 0.2 micron design rule integrated circuit production.

SUMMARY OF THE INVENTION

The invention includes a process for the production of semiconductor devices comprising the steps of depositing a metal layer on a semiconductor substrate, depositing a hardmask layer on said metal layer, depositing a photoresist on said hardmask layer, patterning said photoresist, thereby exposing and patterning portions of said hardmask layer, etching said exposed portions of said hardmask layer with a hardmask etchant, thereby exposing and patterning portions of said metal layer, optionally removing said photoresist, and etching said exposed portions of said metal layer with a metal etchant. The invention includes semiconductor devices made by said process.

BRIEF DESCRIPTION OF THE DRAWINGS

The invention is best understood from the following description when read in connection with the accompanying drawing. It is emphasized that, according to common practice in the semiconductor industry, the various features of the drawing are not to scale. On the contrary, the dimensions of the various features of the drawing are arbitrarily expanded or reduced for clarity. Included in the drawing are the following figures.

DETAILED DESCRIPTION OF THE INVENTION

Figure 1:
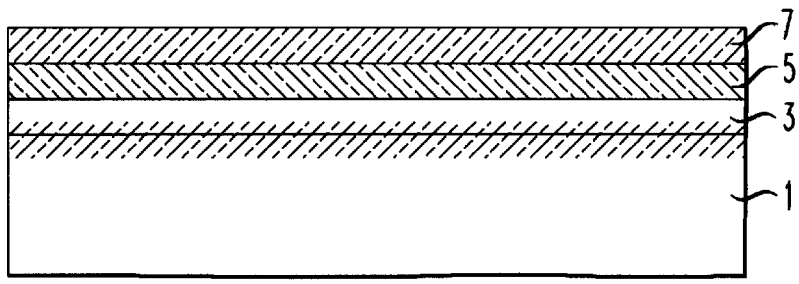
FIG. 1 is a cross-section diagram of a semiconductor wafer showing, from the bottom-up, metal, hardmask and photoresist layers for one embodiment of the invention.

With reference to FIG. 1, the invention lies in the combination of a thin photoresist 7 and thin hardmask 5 as a method of patterning an underlying conductor 3 that in turn overlays a semiconductor substrate 1. As discussed above, the width of the metal lines in silicon and other semiconductor devices shrink to 0.30 micron and lower, the thickness of photoresist (PR) required to pattern the lines needs to decrease substantially to enhance the resolution. However, this decreasing thickness of photoresist results in insufficient photoresist being present to obtain a correctly shaped metal line following the metal etch processing step. It has been discovered that this problem may be solved by depositing another material with greater resistance to metal etchant, e.g. a hardmask such as silicon dioxide, and then patterning the hardmask with thin photoresist. This process, known herein as in-situ hardmask, is applicable to 0.2 micron feature technology and lower. Design rules for 0.2 micron technology specify a metal width of 0.288 micron and a metal spacing of 0.32 micron. The hardmask oxide is typically etched in an oxide etcher, followed by a photoresist strip step and subsequent cleaning steps prior to the metal etch. The hardmask material may be etched in the same (metal) etch tool followed immediately by the metal etch. Process variation and productivity are thereby improved, because numerous processing steps are eliminated between the hardmask and metal etch steps. A novel sequence involves using fluorine-based ($CF_4$, $SF_6$, etc.) chemistry to etch the oxide hardmask followed by chlorine based chemistry for the metal etch. The presence of both photoresist and hardmask is advantageous for the metal etch to provide correctly shaped lines. By using both photoresist and hardmask together in the metal etch, the thickness of both can be reduced, which also improves the deep submicron lithography capability of the stepper as well as increasing productivity and lowering costs. The control of critical dimensions (CD) is improved as described by a decrease in the standard deviation of the final line width measurement after the metal etch. Advantages of the present invention include reduced process variation by elimination of multiple process steps, improved critical dimension control across the wafer and improved productivity and utilization of the metal etch tool.

Figure 2:
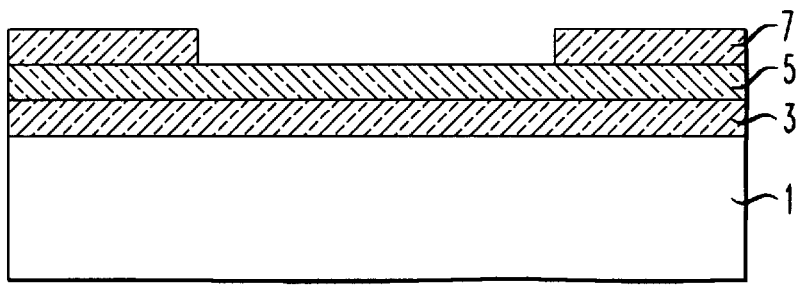
FIG. 2 is a cross-sectional diagram of a semiconductor wafer showing patterning of the photoresist layer for one embodiment of the invention.
Figure 3:
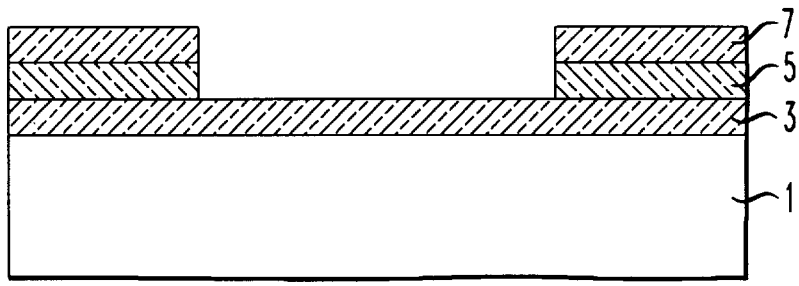
FIG. 3 is a cross-section diagram of a semiconductor wafer showing the hardmask layer partially etched away to form patterned hardmask for one embodiment of the invention.
Figure 4:
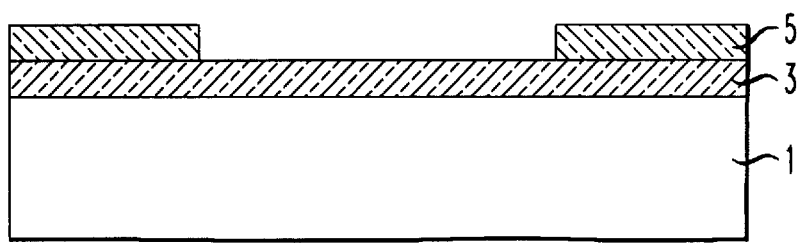
FIG. 4 is a cross-sectional diagram of a semiconductor wafer showing removal of the photoresist layer for one embodiment of the invention.
Figure 5:
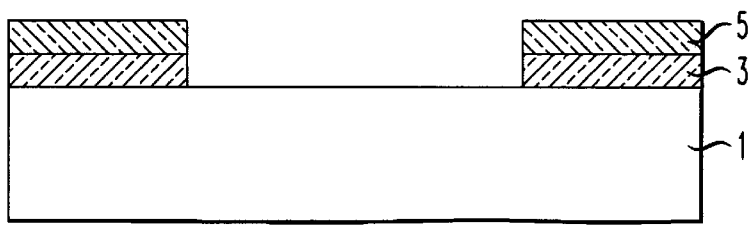
FIG. 5 is a cross-section diagram of a semiconductor wafer showing the metal layer etched away to form a patterned metal layer for one embodiment of the invention.

Referring now to FIG. 1, which shows a semiconductor substrate 1 which has deposited sequentially upon its upper surface, a metal layer 3, a hardmask layer 5 and a photoresist layer 7. The photoresist layer 7 is then patterned, FIG. 2; the hardmask layer 5 is etched, FIG. 3; the photoresist layer 7 is removed, FIG. 4; and finally, the metal layer 3 is etched to form the desired metal lines and features, FIG. 5. The hardmask layer 5 covering the metal layer 3 may be removed, for bond pads and the like, or left in place as desired. Note that the conventional practice is not to have a hardmask layer present as a resist. In the absence of the hardmask layer, a photoresist layer thickness of about 1.07 microns has been traditional, it not being possible to operate at photoresist thicknesses of below about 0.86 micron, however the hardmask layer of the present invention makes possible a photoresist layer 7 thickness of less than 0.86 micron, and preferably less than about 0.76 micron and most advantageously, less than about 0.56 micron. The above process typically ranges from about 0.76 micron to about 0.56 micron. The hardmask layer typically has a thickness of about 200 nm. There may be an optional anti-reflection coating layer (not shown) between the hardmask layer 5 and photoresist layer 7. These anti-reflection coatings are typically about 25 nm of titanium nitride, titanium dioxide and the like.

Figure 6:
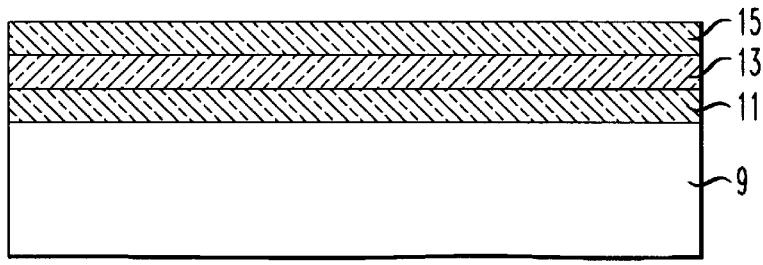
FIG. 6 is a cross-sectional diagram of a semiconductor wafer showing, from the bottom-up, metal, hardmask and photoresist layers for another embodiment of the invention.
Figure 7:
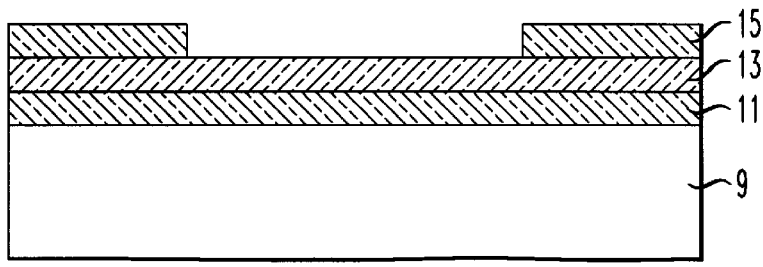
FIG. 7 is a cross-sectional diagram of a semiconductor wafer showing patterning of the photoresist layer for another embodiment of the invention.
Figure 8:
FIG. 8 is a cross-sectional diagram of a semiconductor wafer showing that the patterned photoresist remains in place when etching the metal and hardmask layers away to form patterned metal and hardmask for another embodiment of the invention.
Figure 9:
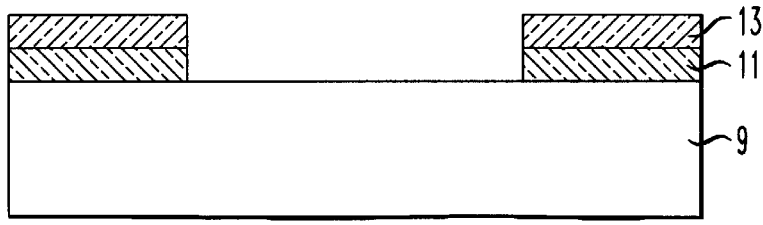
FIG. 9 is a cross-sectional diagram of a semiconductor wafer showing that the patterned photoresist is optionally, but preferably, removed after etching the metal and hardmask layers for another embodiment of the invention.

A second, preferred, embodiment is shown in FIGS. 6 through 9. The stack up of layers in FIG. 6 is the same sequence as in FIG. 1: a semiconductor substrate 9, a metal layer 11, a hardmask layer 13, and a photoresist layer 15. FIG. 7 shows the patterning of the photoresist. The difference in steps between the prior embodiment and this one is shown in FIG. 8. The photoresist layer 15 is left on during the etching of both the hardmask layer 13 and the metal layer 11, instead of being removed prior to etching the metal layer. While not wishing to be held to any theory, one theory explaining the advantage of the present invention is that the presence of the photoresist may protect the hardmask, allowing for hardmask thicknesses of 100 nm and below. Alternatively, keeping the photoresist on may passivate the sidewalls or change the stoichiometry in the etch pit. Removing the photoresist after etching both the metal layer 11 and the hardmask layer 13 yields the stack-up seen in FIG. 9.

The equipment used for the removal of oxides like the hardmask of the present invention is often an MxP+ oxide stripper(available from Applied Materials, Santa Clara, Calif.), while metal etching is typically done with a decoupled plasma source (DPS), also available from Applied Materials. An advantage of the present invention is that both hardmask etching and metal etching can be done sequentially in the same piece of equipment, such as a DPS, with no need to change the wafer being processed to a different tool. "In-situ" refers to etching both the hardmask and metal in the same piece of equipment (tool), as opposed to etching the hardmask in an MpX+ and then transferring the wafer to a DPS for metal etch.

The semiconductor substrates of the present invention include silicon, germanium, III–V compounds such as gallium arsenide, indium phosphide and II–VI compounds such as zinc sulfide. The substrate does not even have to be a semiconductor, as it can be envisioned that metal pads and lines could be formed on portions of, for example, sapphire (aluminum oxide) in silicon-on-sapphire substrates that is locally devoid of silicon or on lithium niobate or other optoelectronic materials on a chip-level integrated optoelectronic device.

The hardmask materials include titanium nitride, silicon oxynitride, silicon nitride, tungsten and titanium, organic hardmasks such as spin-on anti-reflection coating but oxides such as silicon dioxide, spin-on-glass, glasses including borosilicate, phosphosilicate and borophosphosilicate, tantalum oxide, aluminum oxide, and titanium dioxide are preferred. Silicon dioxide hardmask may be applied by many techniques, plasma enhanced tetraethylorthosilicate (PETEOS) was used in the examples below.

The photoresists that may be used are conventional, but for the small features addressed by the present invention, deep ultraviolet resists, including those of the I-line type and 193-nm types are preferred. Electron-beam resists may also be employed.

Etchants for the hardmask will preferably contain fluorine. Fluorine containing etchant gases include $CHF_3$, $SF_6$, $CH_4$, $CCl_2F_2$, $CH_2F_2$, $CH_3F$, $CHClF_2CHCl_2F$, $C_2ClF_3H_2$, octofluorocyclobutane, $C_3F6$, $S_2F_2$, $SF_2$, $SF_4$, $S_2F_{10}$, FCl, $NF_3$, $BF_3$, $F_2$, $Xe_2F_6$, $BFCl_2$, $BF_2Cl$, $XeF_2$, $CH_2F_3CF_3$, $CH_3CFCl_2$, $CFCl_3$, $C_3H_3F_5$, $ClF_3$, $BrF_3$, $BrF_5$ and the like. The hardmask etchant will usually also contain carrier gases and gases comprising non-fluorine halogens like chlorine and bromine, examples of which are listed below. The presence of chlorine or bromine is particularly desirable when a TiN anti-reflection coating is present on top of the hardmask and needs to be removed. The hardmask, in one embodiment, may be wet etched.

The metal etchant gases for the metal will often comprise predominantly non-fluorine halogens such as chlorine and bromine, although small amounts of fluorinated species may be present, as can be seen in the examples below. While not wishing to be held to any theory, large amounts of fluorine containing gas may cause the formation of a micromask when the metal is aluminum. Note that the metal may be any conductive metal or silicide, including copper, gold, silver, platinum, tungsten, molybdenum, chromium, nickel, cobalt silicide, zirconium or titanium or alloy such as AlCu or AlCuSi. Metal etchant gases include $Cl_2$, $ClO_2$, $BCl_3$, $S_2Cl_2$, HBr and the like.

The hardmask and etchant gases may be carried by oxygen, ozone, H2O, CO, CO2, argon, helium, krypton, nitrogen and the like. Note that while nitrogen is normally considered to be an inert gas, the presence of some nitrogen is desirable during metal etching. While the amount of nitrogen used may be zero, metal lifting is apparent at 5 sccm when using an Applied Materials DPS. Flow rates of about 12 to about 20 sccm are preferred, high flow rates of nitrogen leading to excess photoresist particulate generation. While not wishing to be held to any theory, it may be that nitrogen acts to passivate aluminum sidewalls.

Those skilled in the art will realize that power settings, residence times, gas flow rates are equipment specific and will vary from one brand of equipment to another. With respect to preferred gas mixtures and flow rates for the DPS equipment used below, the hardmask etch gas mixture argon flow ranges from about 20 sccm to about 300 sccm, with about 50 sccm being preferred, the hardmask etchant gas also comprises about 10 sccm $BCl_3$, about 25 sccm $CHF_3$ and about 30 sccm $SF_6$, all at a gas pressure ranging from about 5 mT to about 24 mT, with about 10 mT being preferred. The metal etchant gas mixture comprises about 50 sccm to about 70 sccm $Cl_2$, about 20 sccm to about 50 sccm $BCl_3$, about 5 sccm to about 20 sccm $N_2$, and up to about 15 sccm $SF_6$, all at a pressure of about 10 to about 18 mT. The electrical equipment parameters are a top power of about 400 W to about 2000 W, with about 1400 W being preferred, and a bias power of about 80 W to about 500 W, with about 180 W being preferred. The process of the present invention achieves an etch rate of greater than 300 nm/min with less than 2.5% non-uniformity.

EXAMPLES

Examples 1–17

Table 1 shows reaction parameters and results for hardmask etching done in a DPS. "Ox-ER" is oxide etch rate in nm/30 seconds, "Ox-STDV" is oxide critical dimension standard deviation, "PR-ER" is photoresist etch rate in nm/30 seconds, "PR-STDV" is photoresist critical dimension standard deviation, known as percent non-uniformity. Low standard deviation is desirable. Selectivity is photoresist:oxide and it is desirable for selectivity to be low. Etching was performed on blanket, non-patterned wafers.

TABLE 1

Oxide Etch in a DPS

| Example | Pressure mTorr | Top Power Watts | Bias Power Watts | Ar sccm | Ox-ER 30 nm/sec | Ox-STDV | PR-ER 30 nm/sec | PR-STDV | Selectivity |
|---|---|---|---|---|---|---|---|---|---|
| 1 | 10 | 800 | 80 | 20 | 76.3 | 4.723 | 256.1 | 3.479 | 3.356488 |
| 2 | 10 | 800 | 80 | 50 | 84.4 | 4.754 | 253.99 | 3.387 | 3.00936 |
| 3 | 10 | 800 | 180 | 20 | 112.89 | 3.588 | 335.16 | 2.975 | 2.968908 |
| 4 | 10 | 800 | 180 | 50 | 118.55 | 3.472 | 327.9 | 2.847 | 2.765922 |
| 5 | 10 | 1400 | 80 | 20 | 1244.2 | 4.696 | 292.95 | 3.685 | 2.358696 |
| 6 | 10 | 1400 | 80 | 50 | 126.4 | 4.333 | 283.19 | 3.682 | 2.240427 |
| 7 | 10 | 1400 | 180 | 20 | 169.7 | 3.429 | 395.24 | 2.608 | 2.329051 |
| 8 | 10 | 1400 | 180 | 50 | 170.5 | 2.983 | 380.89 | 2.474 | 2.233959 |
| 9 | 24 | 800 | 80 | 20 | 59.1 | 5.625 | 205.58 | 10.186 | 3.478511 |
| 10 | 24 | 800 | 80 | 50 | 62.4 | 5.579 | 214.26 | 9.653 | 3.433654 |
| 11 | 24 | 800 | 180 | 20 | 84.8 | 4.949 | 261.08 | 9.657 | 3.078744 |
| 12 | 24 | 800 | 180 | 50 | 91.4 | 4.682 | 268.82 | 9.361 | 2.941138 |
| 13 | 24 | 1400 | 80 | 20 | — | — | 291.28 | 5.277 | — |
| 14 | 24 | 1400 | 80 | 50 | 112.63 | 4.968 | 289.8 | 5.604 | 2.573027 |
| 15 | 24 | 1400 | 180 | 20 | 155.53 | 3.974 | 387.65 | 5.066 | 2.491644 |
| 16 | 24 | 1400 | 180 | 50 | 158.2 | 3.69 | 383.02 | 4.536 | 2.421113 |
| 17 | 17 | 1100 | 130 | 35 | 135.48 | 4.131 | 331.02 | 4.433 | 2.443313 |

Example 18

Table 2 shows details for a photoresist and hardmask etch similar to that done in example 8 above under the column heading "HM." 0.76 micron of photoresist and 100 nm of PETEOS silicon dioxide were used. The columns labeled "Main," "Over" (for "overetch"), "Barrier" and "Over" are for a subsequent metalal etch, not done in the above examples. "Main" is defined as the main etching of the metal, in this case AlCu, while "Barrier" refers to the etching of the a barrier such as TiN/N. "Overetch" is a clean-up etch designed to remove any residual metal or barrier. Note that the overetch step between the "Main" and "Barrier" steps is optional but preferred.

TABLE 2

DPS Etch Recipe

|  |  | HM | Main | Over | Barrier | Over |
|---|---|---|---|---|---|---|
| Time | sec | 23 | Endpoint | 15% | Endpoint | 25 |
| Pressure | mT | 10 | 10 | 10 | 18 | 18 |
| Top Power | W | 1400 | 1600 | 1000 | 1000 | 1000 |
| Bias Power | W | 180 | 120 | 120 | 160 | 160 |
| $CL_2$ | sccm | — | 70 | 70 | 50 | 50 |
| $BCl_3$ | sccm | 10 | 20 | 20 | 50 | 50 |
| $N_2$ | sccm | — | 12 | 12 | 20 | 20 |
| $CHF_3$ | sccm | 25 | — | — | — | — |
| Ar | sccm | 50 | — | — | — | — |
| $SF_6$ | sccm | 30 | — | — | 15 | — |

Example 19

Silicon dioxide hardmask with an overcoating of TiN was etched in an MxP+. The power was 450 W, pressure was at 85 mT, argon flow was 60 sccm, $CHF_3$ flow was 20 sccm, $CF_4$ flow was 20 sccm, the field was 50 G and the time was 48 seconds. The resulting etch rate was 275 nm/min and the uniformity was less than 2.5%.

Examples 21–23

Critical dimension measurements (9 each) were made on in-situ hardmask (HM). The results are listed in Table 3. MxP HMw/PR denotes MxP+ hardmask etch, no PR strip, then DPS, while MxP HMw/oPR means MxP+ hardmask etch, with PR strip, then DPS. "Mean" is in microns, "Std Dev" is standard deviation and "Std Err Mean" is standard error mean. Note that the standard deviation of the in-situ hardmask process of the present invention is almost half that of the best alternative.

TABLE 3

Critical Dimension Measurements

| Example |  | Number | Mean | Std. Dev. | Std. Err Mean |
|---|---|---|---|---|---|
| 21 | In-Situ Hm | 9 | 0.276600 | 0.005447 | 0.00182 |
| 22 | MxP HMw/PR | 9 | 0.278256 | 0.010779 | 0.00359 |
| 23 | MxP HMw/oPR | 9 | 0.286622 | 0.012667 | 0.00422 |

Example 24

Silicon dioxide deposited via PETEOS was etched in a DPS. The top power was 1000 W, bias power was 140 W, pressure was at 17 mT, argon flow was 40 sccm, $CHF_3$ flow was 20 sccm, $CF_4$ flow was 20 sccm, $BCl_3$ flow was 10 sccm and the time was 48 seconds. The resulting etch rate was 230 nm/min.

Examples 25–26

Example 25 shows, in Table 4 a control line width pattern results for 1.07 micron Ultra I-120 resist (available form Shipley, Inc., Marlboro, Mass.) on an stack-up of 25 nm TiN/600 nm AlCu/60 nm TiN and 30 nm Ti, with no hardmask, shot 580/−0.1. The test patterns are nested nominal and subnominal (alternating ellipses and rectangles) and isolated nominal and subnominals (ellipses), shot 480/−0.1. Measurements were linear 50/1/1/1. Example 26 shows, in Table 5, the line width pattern results for 0.76 micron Ultra 1-1 20 photoresist and 100 nm hardmask on the same stack-up as above. Note that the "PR" column is line width of photoresist and the 3 sigma column adjacent is a measure of line width variability. "FN" is final line width, after etching, and the 3 sigma column immediately adjacent is a measure of final linewidth variation. "LCF" refers to a linewidth control feature.

TABLE 4

Line Width Without Hardmask

|  | PR | 3 sigma | FN | 3 sigma |
|---|---|---|---|---|
| LCF-n | 0.382 | 0.033 | 0.453 | 0.069 |
| LCF-l | 0.392 | 0.027 | 0.594 | 0.075 |
| Nom-Chain-n | 0.469 | 0.033 | 0.57 | 0.042 |
| Nom-Chain-l | 0.489 | 0.024 | 0.647 | 0.072 |
| Sub-Chain-n | 0.441 | 0.03 | 0.487 | 0.057 |
| Sub-Chain-l | 0.436 | 0.027 | 0.596 | 0.069 |

TABLE 5

Line Width With Hardmask

|  | PR | 3 sigma | FN | 3 sigma |
|---|---|---|---|---|
| LCF-n | 0.381 | 0.036 | 0.473 | 0.039 |
| LCF-l | 0.392 | 0.033 | 0.594 | 0.06 |
| Nom-Chain-n | 0.483 | 0.036 | 0.583 | 0.045 |
| Nom-Chain-l | 0.489 | 0.033 | 0.634 | 0.063 |
| Sub-Chain-n | 0.455 | 0.03 | 0.527 | 0.039 |
| Sub-Chain-l | 0.451 | 0.033 | 0.585 | 0.054 |

Note that the variability of the final line width of the control, Table 4, ranges from 0.042 to 0.075, with an average 3 sigma of 0.064. The present invention has a variability, expressed as final linewidth 3 sigma, ranging from 0.039 to 0.63, with an average 3 sigma of 0.05, the prior art has a 3 sigma variability that is 28% larger, when measured by the average.

Although the invention has been described with reference to illustrative embodiments, it is not limited to those embodiments. Rather, the appended claims should be construed to include other variants and embodiments of the invention that may be made by those skilled in the art without departing from the spirit and scope of the present invention.

We claim:

1. A process for the production of a semiconductor device comprising the steps of:
   depositing a metal layer on a semiconductor substrate;
   plasma depositing a hardmask layer on said metal layer;
   depositing a photoresist on said hardmask layer, wherein said photoresist is less than about 0.86 microns thick;
   patterning said photoresist, thereby exposing portions of said hardmask layer;
   etching said exposed portions of said hardmask layer with a hardmask etchant, thereby exposing portions of said metal layer; and
   etching said exposed portions of said metal layer with a metal etchant.

2. The process of claim 1, wherein said hardmask comprises a hardmask selected from the group consisting of silicon dioxide, silicon oxynitride, titanium nitride, tungsten, titanium, tantalum oxide, aluminum oxide and mixtures thereof.

3. The process of claim 1, wherein said hardmask is from about 100 nm to about 225 nm thick.

4. The process of claim 1, wherein said hardmask is about 125 nm thick.

5. The process of claim 1, wherein said hardmask is up to about 100 nm thick.

6. The process of claim 1, wherein said photoresist is from about 0.56 micron to about 0.76 micron thick.

7. The process of claim 1, wherein said hardmask etchant comprises a fluorine containing gas.

8. The process of claim 1, wherein said hardmask etchant comprises a fluorine containing gas selected from the group consisting of $CHF_3$, $SF_6$, $CH_4$, $CCl_2F_2$, $CH_2F_2$, $CH_3F$, $CHClF_2CHCl_2F$, $C_2ClF_3H_2$, octofluorocyclobutane, $C_3F6$, $S_2F_2$, $SF_2$, $SF_4$, $S_2F_{10}$, FCl, $NF_3$, $BF_3$, $F_2$, $Xe_2F_6$, $BFCl_2$, $BF_2Cl$, $XeF_2$, $CH_2F_3CF_3$, $CH_3CFCl_2$, $CFCl_3$, $C_3H_3F_5$, $ClF_3$, $BrF_3$, $BrF_5$ and mixtures thereof.

9. The process of claim 1, wherein said metal etchant comprises a gas selected from the group of consisting of chlorine containing gases, bromine containing gas and mixtures thereof.

10. The process of claim 1, wherein said metal etchant comprises a gas selected from the group consisting of $Cl_2$, $ClO_2$, $BCl_3$, $S_2Cl_2$, HBr and mixtures thereof.

11. The metal etchant of claim 10, further comprising nitrogen.

12. The process of claim 1, further comprising the step of removing said photoresist before etching said exposed portion of said metal layer.

13. A semiconductor device, produced by the process of claim 1.

14. A process for the production of a semiconductor device comprising the steps of:
   depositing a metal layer on a semiconductor substrate;
   depositing a hardmask layer on said metal layer, wherein said hardmask comprises about 200 nm of silicon dioxide and about 25 nm of titanium nitride;
   depositing a photoresist on said hardmask layer, wherein said photoresist is about 0.76 micron thick;
   patterning said photoresist, thereby exposing portions of said hardmask layer;
   etching said exposed portions of said hardmask layer with a first etchant, wherein said first etchant comprises an etchant selected from the group consisting of $SF_6$, $CHF_3$, $BCl_3$, $Cl_2$, and mixtures thereof, thereby exposing portions of said metal layer; and
   etching said exposed portions of said metal layer with a second etchant, wherein said second etchant comprises an etchant selected from the group consisting of $N_2$, $BCl_3$, $Cl_2$, and mixtures thereof.

15. A semiconductor device, produced by the process of claim 14.

16. A process for the production of semiconductor devices comprising the steps of:
   depositing a metal layer on a semiconductor substrate;
   depositing a hardmask layer on said metal layer, wherein said hardmask comprises about 100 nm of silicon dioxide and about 25 nm of titanium nitride;
   depositing a photoresist on said hardmask layer, wherein said photoresist is about 0.76 micron thick;
   patterning said photoresist, thereby exposing portions of said hardmask layer;
   etching said exposed portions of said hardmask layer with a first etchant, wherein said first etchant comprises an etchant selected from the group consisting of $SF_6$, $CHF_3$, $BCl_3$, $Cl_2$, and mixtures thereof, thereby exposing portions of said metal layer;

not removing said photoresist; and etching said exposed portions of said metal layer with a second etchant, wherein said second etchant comprises an etchant selected from the group consisting of $BCl_3$, $Cl_2$, $N_2$ and mixtures thereof.

17. A semiconductor device, produced by the process of claim 16.

18. A semiconductor device made to 0.2 micron design rules having a non-uniformity of about 2.5% to about 5%.

19. The semiconductor device of claim 18 having a non-uniformity of about 2.9% to about 3.4%.

20. A semiconductor device made to 0.2 micron design rules having a critical dimension standard deviation of about 0.005 to about 0.01.

21. A semiconductor device comprising hardmask lines having a thickness of about 100 nm to about 225 nm, wherein said hardmask lines have a non-uniformity of about 2.5% to about 5%.

22. The semiconductor device of claim 21, having a non-uniformity of about 2.9% to about 3.4%.

* * * * *